US012317565B2

(12) United States Patent
Yeh

(10) Patent No.: US 12,317,565 B2
(45) Date of Patent: May 27, 2025

(54) MANUFACTURING METHOD OF SEMICONDUCTOR DEVICE

(71) Applicant: UNITED MICROELECTRONICS CORP., Hsin-Chu (TW)

(72) Inventor: Chih-Tung Yeh, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/757,558

(22) Filed: Jun. 28, 2024

(65) Prior Publication Data

US 2024/0355887 A1 Oct. 24, 2024

Related U.S. Application Data

(62) Division of application No. 17/543,607, filed on Dec. 6, 2021, now Pat. No. 12,262,554.

(30) Foreign Application Priority Data

Nov. 9, 2021 (CN) .......................... 202111318428.7

(51) Int. Cl.
*H10D 64/01* (2025.01)
*H01L 21/225* (2006.01)
*H10D 30/47* (2025.01)
*H10D 62/13* (2025.01)
*H10D 62/85* (2025.01)
(Continued)

(52) U.S. Cl.
CPC .......... *H10D 64/01* (2025.01); *H10D 62/149* (2025.01); *H10D 64/251* (2025.01); *H01L 21/2258* (2013.01); *H10D 30/475* (2025.01); *H10D 62/85* (2025.01); *H10D 64/62* (2025.01)

(58) Field of Classification Search
CPC .............. H01L 29/401; H01L 29/0843; H01L 29/41725; H01L 21/2258; H01L 29/452; H01L 29/7786; H01L 21/28575; H01L 29/2003; H01L 29/41766; H01L 29/66462; H01L 29/778; H10D 64/01; H10D 62/149; H10D 64/251; H10D 30/475; H10D 62/85; H10D 64/62; H10D 30/015; H10D 62/8503; H10D 64/256; H10D 30/47
See application file for complete search history.

(56) References Cited

U.S. PATENT DOCUMENTS 8,912,844 B2 12/2014 Li
9,214,352 B2 * 12/2015 Hagleitner ............ H01L 29/452
9,793,345 B1 10/2017 He
(Continued)

OTHER PUBLICATIONS

Jayachandran, A Survey of Technology Issues in High performance GaN/AlGaN HEMT Devices, International Journal of Innovative Trends in Engineering (IJITE), vol. 10, No. 01, Nov. 1, 2015.
(Continued)

*Primary Examiner* — Jonathan Han
(74) *Attorney, Agent, or Firm* — Winston Hsu

(57) ABSTRACT

A semiconductor device includes a III-V compound semiconductor layer and a source/drain structure. The source/drain structure is disposed on the III-V compound semiconductor layer. The source/drain structure includes a metal layer and metal silicide patterns. The metal layer is disposed on the metal silicide patterns, and a portion of the metal layer is disposed between the metal silicide patterns adjacent to each other.

7 Claims, 12 Drawing Sheets

(51) Int. Cl.
*H10D 64/23* (2025.01)
*H10D 64/62* (2025.01)

(56) References Cited

U.S. PATENT DOCUMENTS

| | | |
|---|---|---|
| 10,062,943 B2 | 8/2018 | Li |
| 10,153,342 B1 | 12/2018 | He |
| 10,262,986 B2 | 4/2019 | Dai |
| 10,985,271 B2 | 4/2021 | Yang |
| 11,081,579 B2 | 8/2021 | Chang |
| 11,239,327 B2 | 2/2022 | Lee |
| 11,264,492 B2 | 3/2022 | Huang |
| 11,296,214 B2 | 4/2022 | Lee |
| 2005/0258451 A1* | 11/2005 | Saxler ............... H01L 29/66454 |
| | | 257/E21.406 |
| 2011/0233520 A1* | 9/2011 | Jeon .................. H01L 29/41766 |
| | | 257/E21.403 |
| 2011/0233612 A1 | 9/2011 | Park |
| 2016/0284827 A1* | 9/2016 | Chiang ............... H01L 29/7787 |
| 2017/0077255 A1 | 3/2017 | Yao |

OTHER PUBLICATIONS

Van Daele, The role of Al on Ohmic contact formation on n-type GaN and AlGaN/GaN, Applied Physics Letters 87, 061905(2005), Aug. 2, 2005.

* cited by examiner

MANUFACTURING METHOD OF SEMICONDUCTOR DEVICE

CROSS REFERENCE TO RELATED APPLICATIONS

This application is a division of U.S. application Ser. No. 17/543,607, filed on Dec. 6, 2021. The content of the application is incorporated herein by reference.

BACKGROUND OF THE INVENTION

1. Field of the Invention

The present invention relates to a semiconductor device and a manufacturing method thereof, and more particularly, to a semiconductor device including a III-V compound semiconductor layer and a manufacturing method thereof.

2. Description of the Prior Art

Because of the semiconductor characteristics, III-V semiconductor compounds may be applied in many kinds of integrated circuit devices, such as high power field effect transistors, high frequency transistors, or high electron mobility transistors (HEMTs). In the high electron mobility transistor, two semiconductor materials with different bandgaps are combined and heterojunction is formed at the junction between the semiconductor materials as a channel for carriers. In recent years, gallium nitride (GaN) based materials have been applied in the high power and high frequency products because of the properties of wider bandgap and high saturation velocity. Two-dimensional electron gas (2DEG) may be generated by the piezoelectricity property of the GaN-based materials, and the switching velocity may be enhanced because of the higher electron velocity and the higher electron density of the 2DEG. Therefore, how to further improve the electrical performance of transistors formed with III-V compound materials by modifying materials, structures and/or manufacturing methods has become a research direction for people in the related fields.

SUMMARY OF THE INVENTION

A semiconductor device and a manufacturing method thereof are provided in the present invention. A source/drain structure is formed with metal silicide patterns and a metal layer disposed on the metal silicide patterns and partly located between the metal silicide patterns adjacent to each other. The contact resistance between the source/drain structure and a III-V compound semiconductor layer may be reduced accordingly, and the operation performance of the semiconductor device may be enhanced.

According to an embodiment of the present invention, a semiconductor device is provided. The semiconductor device includes a III-V compound semiconductor layer and a source/drain structure. The source/drain structure is disposed on the III-V compound semiconductor layer, and the source/drain structure includes a plurality of metal silicide patterns and a metal layer. The metal layer is disposed on the metal silicide patterns, and a portion of the metal layer is disposed between the metal silicide patterns adjacent to each other.

According to an embodiment of the present invention, a manufacturing method of a semiconductor device is provided. The manufacturing method includes the following steps. A source/drain structure is formed on a III-V compound semiconductor layer. The source/drain structure includes a plurality of metal silicide patterns and a metal layer. The metal layer is disposed on the metal silicide patterns, and a portion of the metal layer is disposed between the metal silicide patterns adjacent to each other.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-7 are schematic drawings illustrating a manufacturing method of the semiconductor device according to the first embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
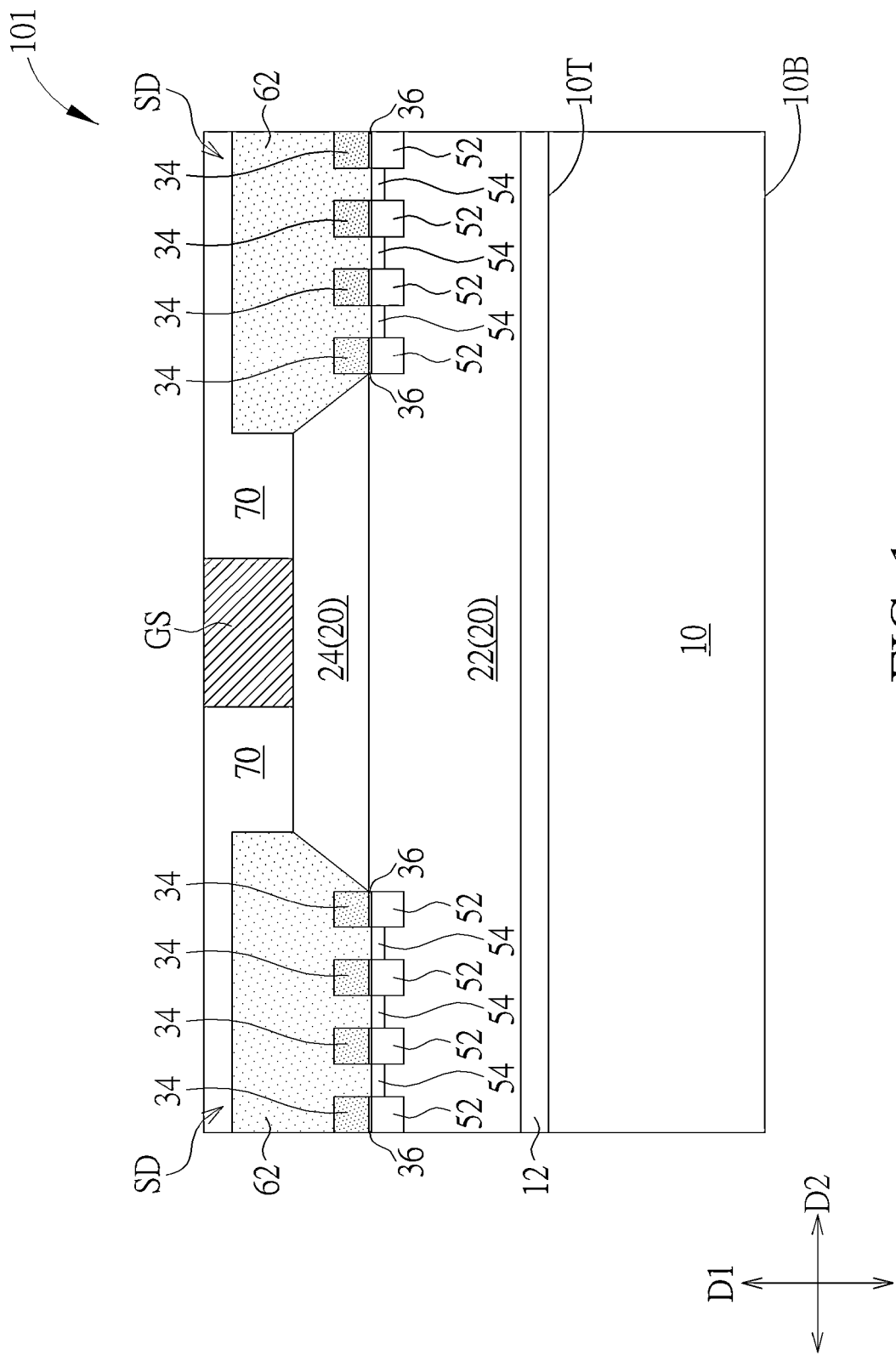
FIG. 1 is a schematic drawing illustrating a semiconductor device according to a first embodiment of the present invention.

Please refer to FIG. 1. FIG. 1 is a schematic drawing illustrating a semiconductor device 101 according to a first embodiment of the present invention. As shown in FIG. 1, the semiconductor device 101 includes a III-V compound semiconductor layer 20 and a source/drain structure SD. The source/drain structure SD is disposed on the III-V compound semiconductor layer 20, and the source/drain structure SD includes a plurality of metal silicide patterns 34 and a metal layer 62. The metal layer 62 is disposed on the metal silicide patterns 34, and a portion of the metal layer 62 is disposed between the metal silicide patterns 34 adjacent to each other. A contact resistance between the source/drain structure SD and the III-V compound semiconductor layer 20 may be reduced by the allocations of the metal silicide patterns 34 and the metal layer 20, and the operation performance of the semiconductor device 101 may be enhanced accordingly.

Specifically, in some embodiments, the semiconductor device 101 may further include a substrate 10 and a buffer layer 12. The III-V compound semiconductor layer 20 may be disposed on the substrate 10, and the buffer layer 12 may be disposed between the substrate 10 and the III-V compound semiconductor layer 20 in a vertical direction (such as a first direction D1 shown in FIG. 1). In some embodiments, the substrate 10 may include a silicon substrate, a silicon carbide (SiC) substrate, a gallium nitride (GaN) substrate, a sapphire substrate, or a substrate made of other suitable materials. The buffer layer 12 may include gallium nitride, aluminum gallium nitride (AlGaN), aluminum indium nitride (AlInN), or other suitable buffer materials.

In some embodiments, the first direction D1 described above may be regarded as a thickness direction of the substrate 10, and the substrate 10 may have a top surface 10T and a bottom surface 10B opposite to the top surface 10T in the first direction D1. The buffer layer 12, the III-V compound semiconductor layer 20, and the source/drain structure SD may be disposed at a side of the top surface 10T. In addition, a horizontal direction substantially orthogonal to the first direction D1 (such as a second direction D2 shown in FIG. 1 and other directions orthogonal to the first direction D1) may be substantially parallel with the top surface 10T and/or the bottom surface 10B of the substrate 10, but not limited thereto. In this description, a distance between the bottom surface 10B of the substrate 10 and a relatively higher location and/or a relatively higher part in the vertical direction (such as the first direction D1) may be greater than a distance between the bottom surface 10B of the substrate 10 and a relatively lower location and/or a relatively lower part in the first direction D1. The bottom or a lower portion of each component may be closer to the bottom surface 10B of the substrate 10 in the first direction D1 than the top or upper portion of this component. Another component disposed above a specific component may be regarded as being relatively far from the bottom surface 10B of the substrate 10 in the first direction D1, and another component disposed under a specific component may be regarded as being relatively closer to the bottom surface 10B of the substrate 10 in the first direction D1.

In some embodiments, the semiconductor device 101 may further include a gate structure GS, two source/drain structures SD, and a protection layer 70. The gate structure GS may be disposed on the III-V compound semiconductor layer 20 in the first direction D1, and the two source/drain structures SD may be disposed at two opposite sides of the gate structure GS in the horizontal direction (such as the second direction D2), respectively, but not limited thereto. The gate structure GS may include a metallic electrically conductive material or other suitable electrically conductive materials. The metallic electrically conductive materials mentioned above may include gold (Au), tungsten (W), cobalt (Co), nickel (Ni), titanium (Ti), molybdenum (Mo), copper (Cu), aluminum (Al), tantalum (Ta), palladium (Pd), platinum (Pt), a compound of the above-mentioned materials, a stacked layer of the above-mentioned materials, or an alloy of the above-mentioned materials, but not limited thereto. The protection layer 70 may include a single layer or multiple layers of dielectric material, such as oxide dielectric material, or other suitable dielectric materials.

Additionally, in some embodiments, the III-V compound semiconductor layer 20 may include a III-V compound semiconductor channel layer 22 and a III-V compound semiconductor cap layer 24, and the III-V compound semiconductor cap layer 24 may be disposed on the III-V compound semiconductor channel layer 22 in the first direction D1. In some embodiments, the III-V compound semiconductor channel layer 22 may include gallium nitride, indium gallium nitride (InGaN), or other suitable III-V compound semiconductor materials. The III-V compound semiconductor cap layer 24 may include aluminum gallium nitride, aluminum indium nitride, aluminum gallium indium nitride (AlGaInN), aluminum nitride (AlN), or other suitable III-V compound semiconductor materials.

In some embodiments, the gate structure GS may be disposed on the III-V compound semiconductor cap layer 24, a portion of the III-V compound semiconductor channel layer 22 may not be covered by the III-V compound semiconductor cap layer 24 in the first direction D1, and a portion of the source/drain structure SD (such as the metal silicide patterns 34 and a part of the metal layer 62) may be disposed on the III-V compound semiconductor channel layer 22 which is not covered by the III-V compound semiconductor cap layer 24 in the first direction D1, but not limited thereto. Additionally, in some embodiments, the metal layer 62 of the source/drain structure SD and a portion of the III-V compound semiconductor cap layer 24 may overlap in the first direction D1, and the source/drain structure SD may cover and contact a portion of the III-V compound semiconductor cap layer 24 and a portion of the III-V compound semiconductor channel layer 22 in the first direction D1.

In some embodiments, a material composition of the metal layer 62 may be different from a material composition of each of the metal silicide patterns 34. For example, the metal silicide pattern 34 may include titanium silicide (TiSi$_x$) or other suitable electrically conductive metal silicide, and the metal layer 62 may include aluminum, tantalum, molybdenum, titanium, or other suitable electrically conductive metallic materials. In some embodiments, the metal silicide patterns 34 in the source/drain structure SD may be separated from one another, the metal layer 62 may contact each of the metal silicide patterns 34, and the space between the metal silicide patterns 34 adjacent to each other may be filled with the metal layer 62, but not limited thereto. In some embodiments, at least some of the metal silicide patterns 34 may be connected with each other, but the portion of the III-V compound semiconductor layer 20 (such as the III-V compound semiconductor channel layer 22) located corresponding to the source/drain structure SD may not be completely covered by the metal silicide patterns 34, and a part of the metal layer 62 may be formed on the III-V compound semiconductor channel layer 22 which is not covered by the metal silicide patterns 34 accordingly.

In some embodiments, the source/drain structure SD may further include a plurality of metal nitride layers 36, and each of the metal nitride layers 36 may be disposed between one of the metal silicide patterns 34 and the III-V compound semiconductor layer 20 in the first direction D1. In other words, each of the metal nitride layers 36 and the corresponding metal silicide pattern 34 may overlap in the first direction D1, and the metal nitride layer 36 may be separated from one another, but not limited thereto. Additionally, each of the metal nitride layers 36 may include nitride of a metallic element (such as titanium nitride, TiN) and each of the metal silicide patterns 34 may include silicide of the metallic element (such as titanium silicide), and the metal silicon pattern 34 and the metal nitride layer 36 may include the same metallic element, but not limited thereto.

In some embodiments, the semiconductor device 101 may further include a plurality of first n-type semiconductor regions (such as n-type semiconductor regions 52 shown in FIG. 1) and a plurality of second n-type semiconductor regions (such as n-type semiconductor regions 54 shown in FIG. 1). The n-type semiconductor regions 52 and the n-type semiconductor regions 54 may be disposed in the III-V compound semiconductor layer 20, such as being disposed in the III-V compound semiconductor channel layer 22, but not limited thereto. Each of the n-type semiconductor regions 52 may be disposed corresponding to one of the metal silicide patterns 34 in the first direction D1, at least a part of the n-type semiconductor region 54 may be located between the n-type semiconductor regions 52 adjacent to each other, and the n-type semiconductor regions 54 may be disposed corresponding to the portion of the metal layer 62 disposed between the metal silicide patterns 34 in the first direction D1.

Each of the n-type semiconductor regions 52 and each of the n-type semiconductor regions 54 may respectively include an n-type III-V compound semiconductor region induced by nitrogen vacancies or other suitable kinds of n-type III-V compound semiconductor regions. The nitrogen vacancies in the III-V compound semiconductor channel layer 22 and/or the III-V compound semiconductor cap layer 24 may be used to form donor-like traps, and the region including relatively more nitrogen vacancies may have the characteristics of an n-type III-V compound semiconductor region. The n-type semiconductor regions 52 disposed in the III-V compound semiconductor layer 20 and/or the n-type semiconductor regions 54 disposed in the III-V compound semiconductor layer 20 may be used to reduce the potential barrier at the interface between the source/drain structure SD and the III-V compound semiconductor layer 20, the contact resistance between the source/drain structure SD and the III-V compound semiconductor layer 20 may be reduced, and the operation performance of the semiconductor device 101 may be enhanced accordingly.

Figure 2:
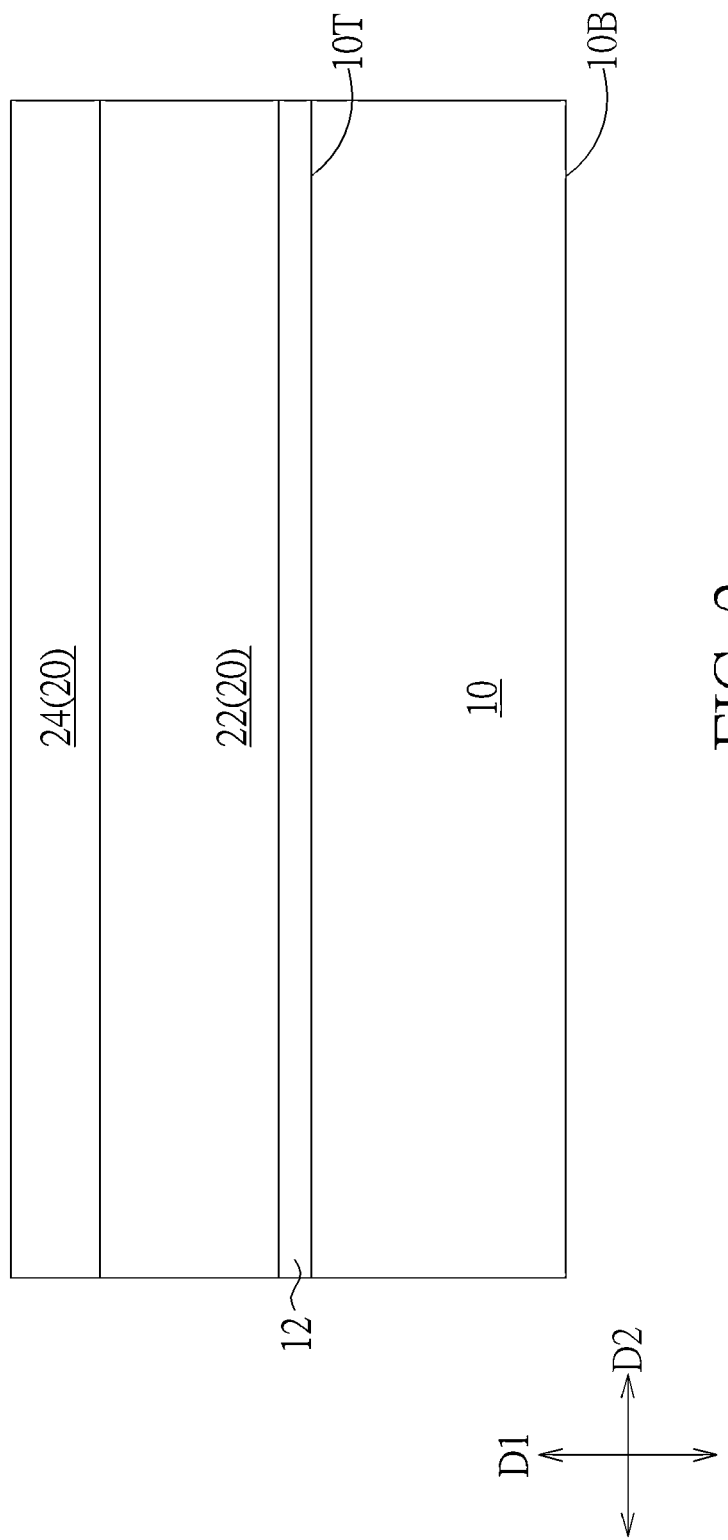
Figure 3:
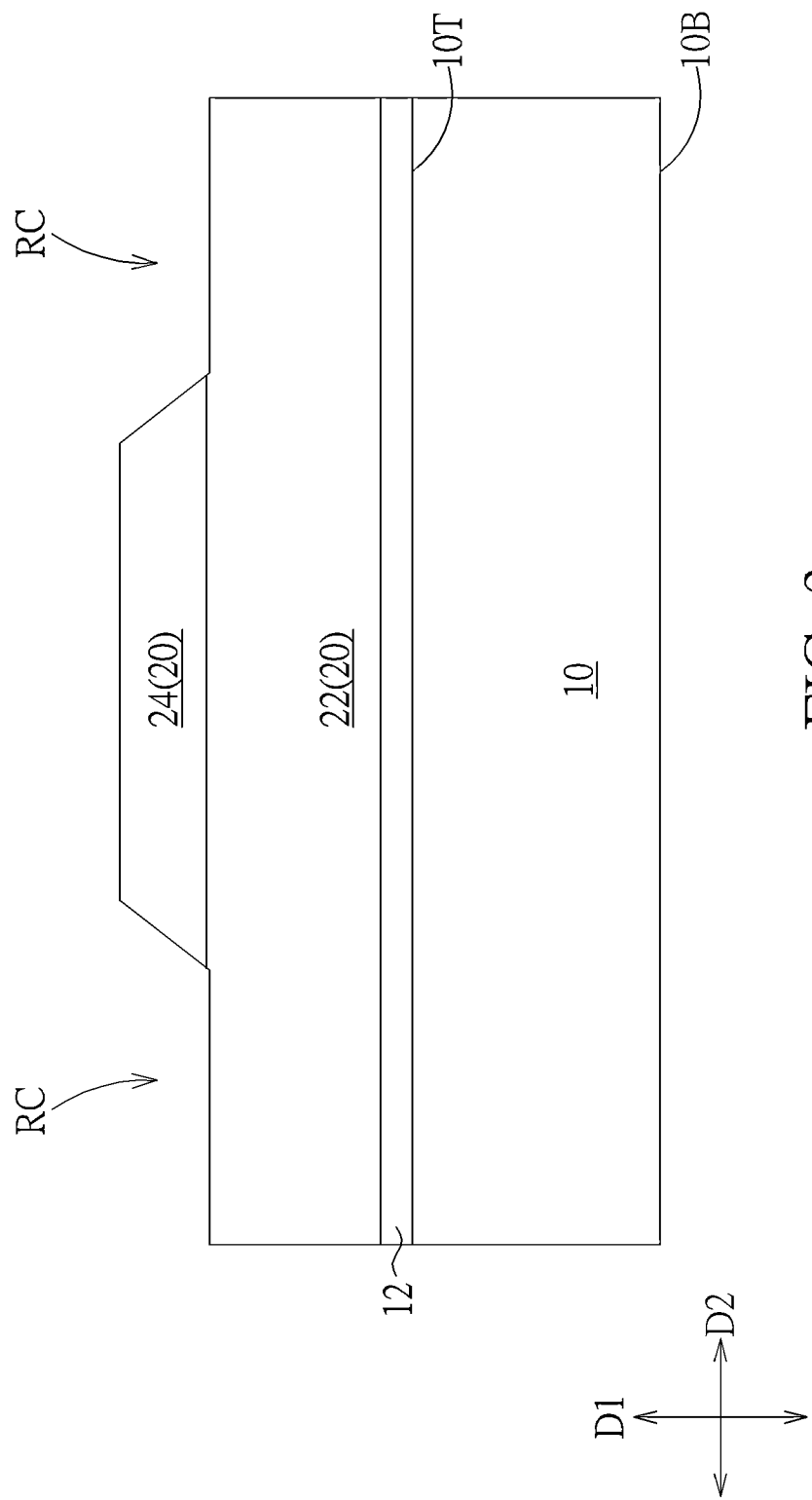
Figure 4:
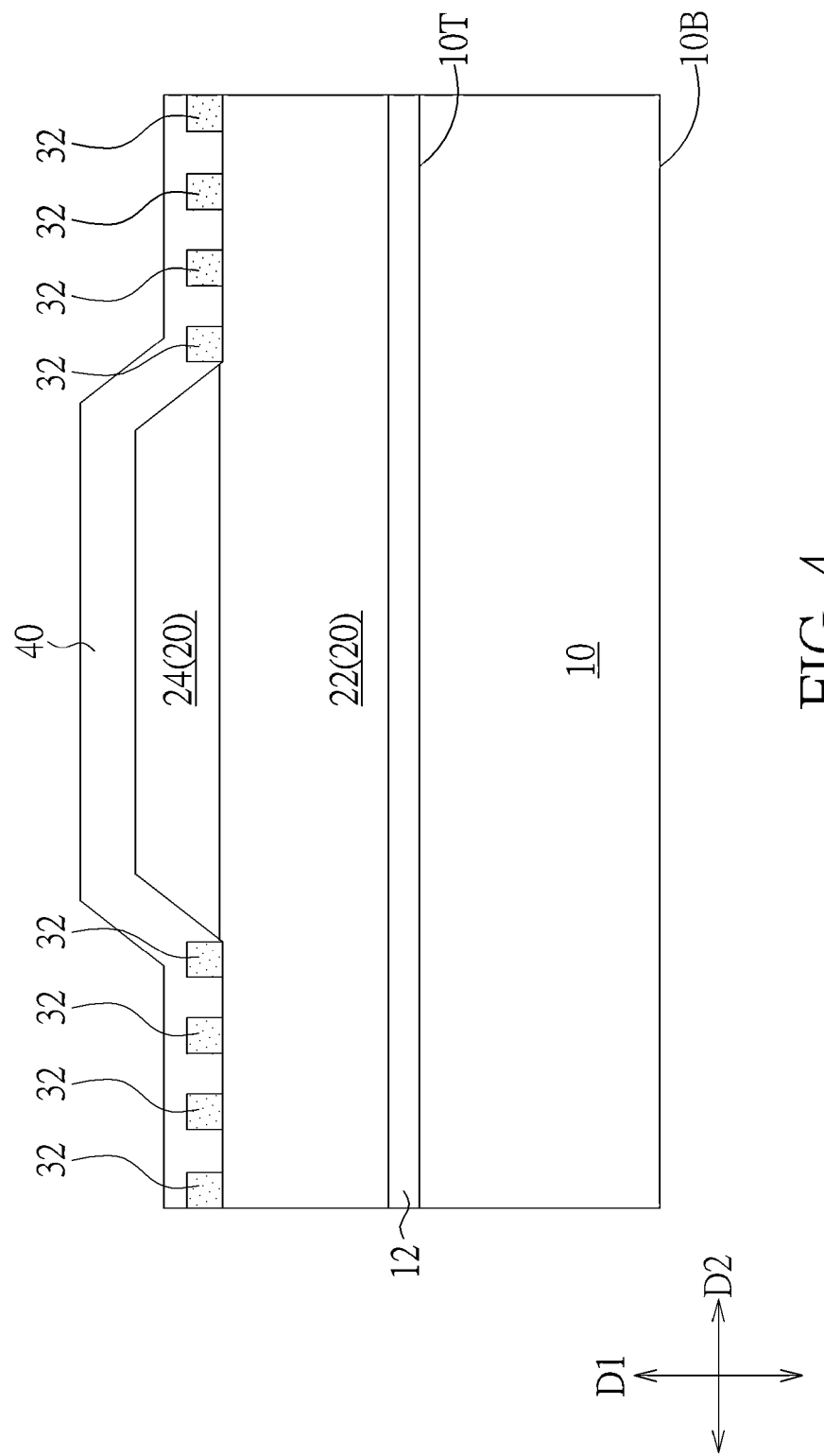
Figure 5:
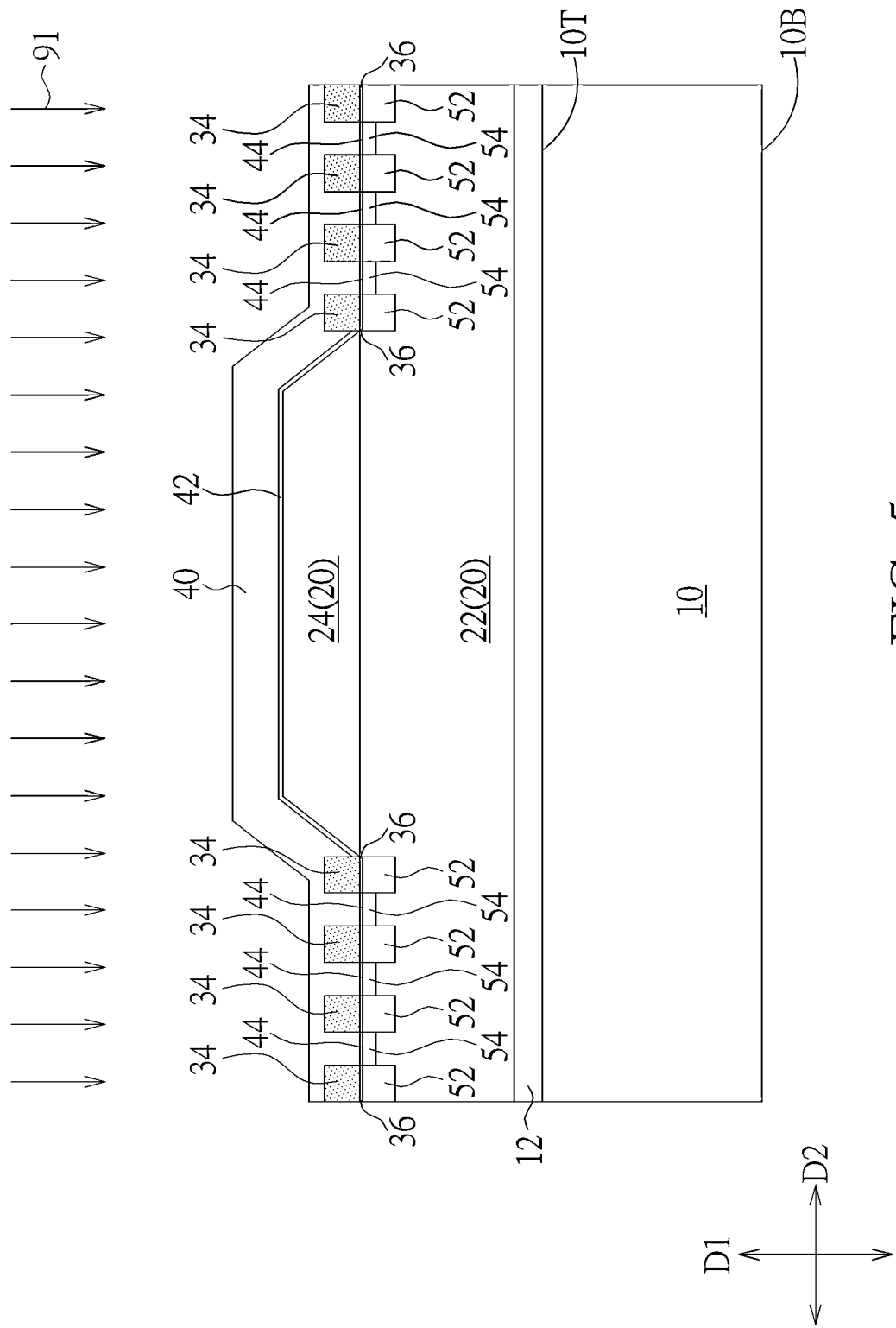
Figure 6:
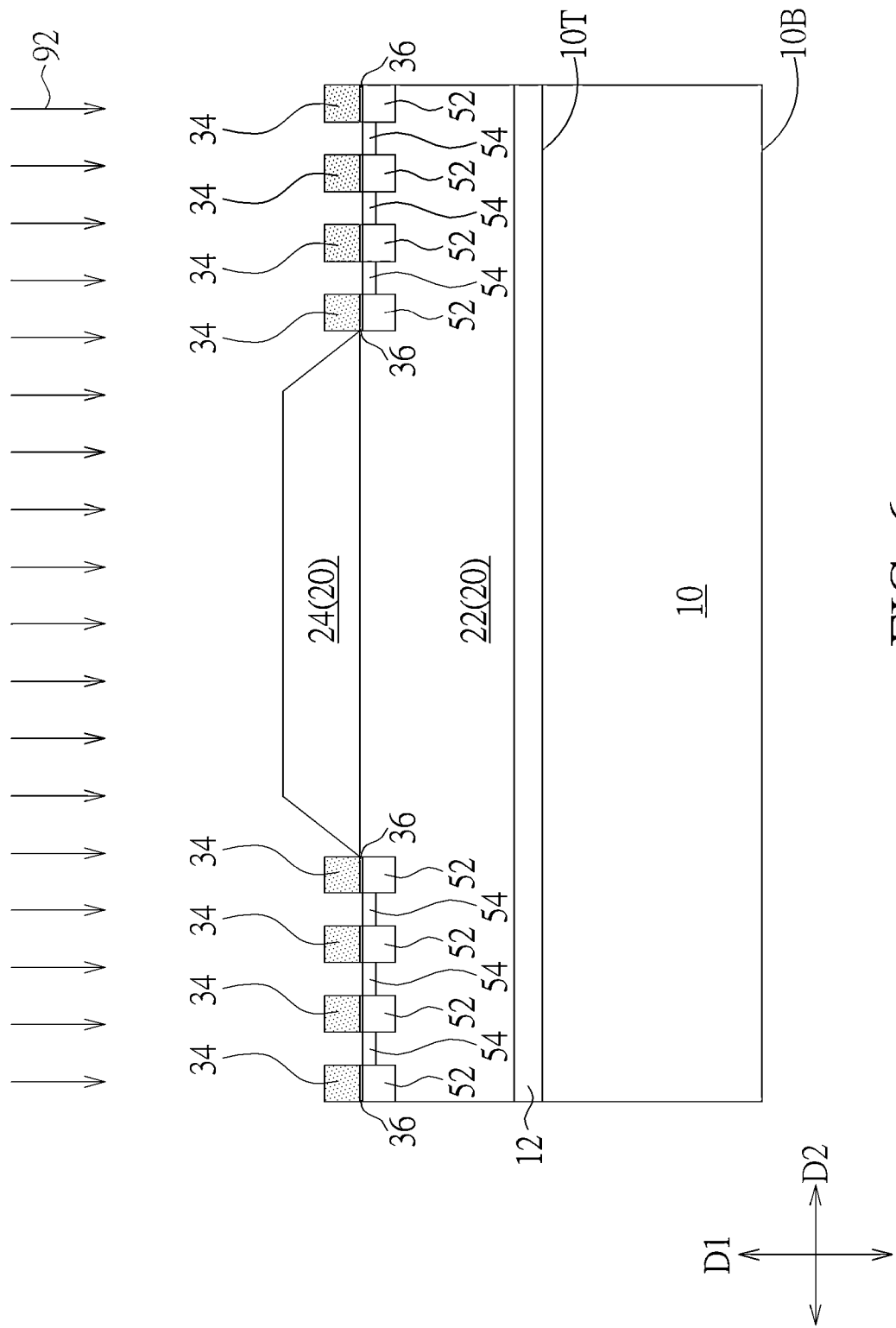
Figure 7:
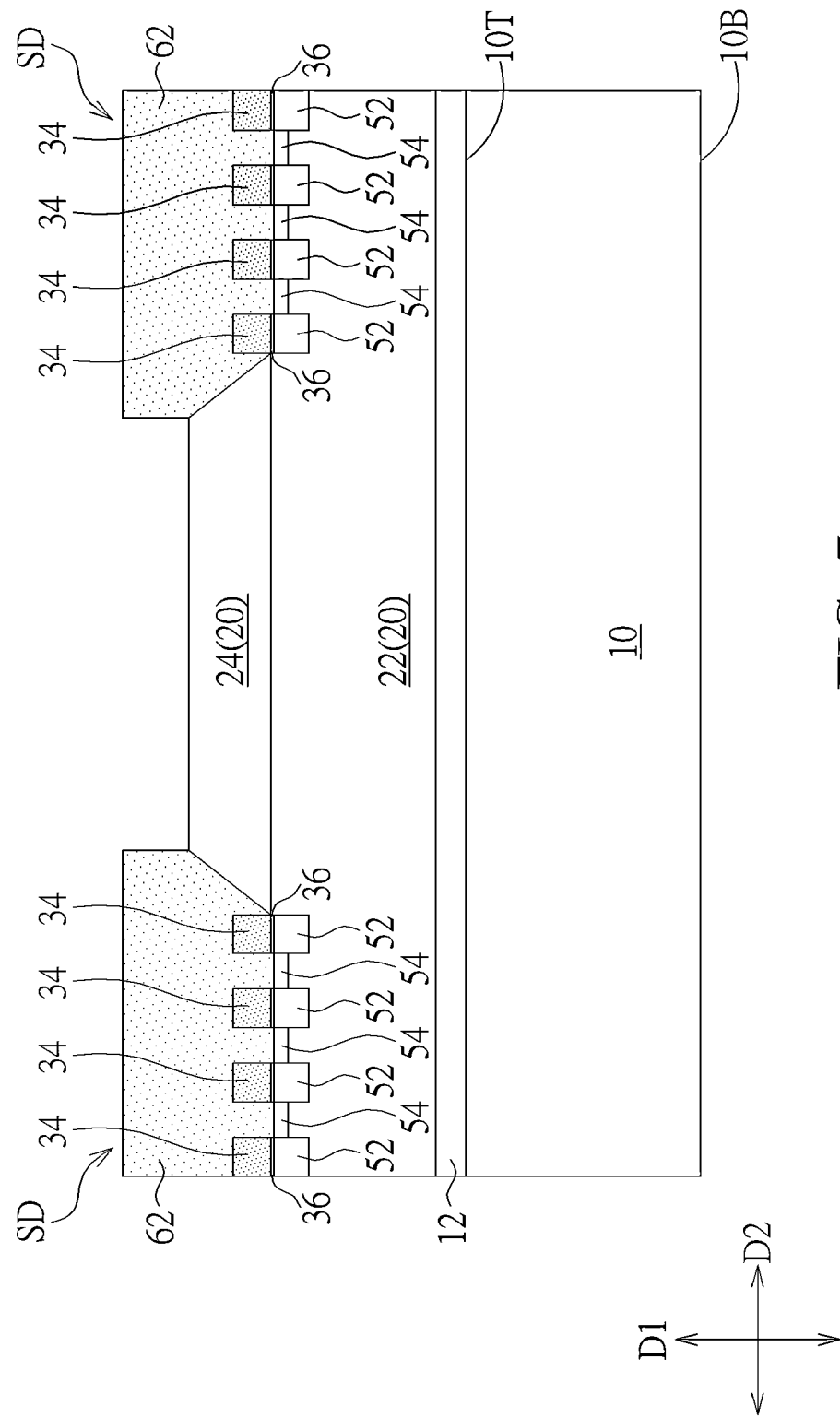

Please refer to FIGS. 1-7. FIGS. 2-7 are schematic drawings illustrating a manufacturing method of the semiconductor device according to the first embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6. In some embodiments, FIG. 1 may be regarded as a schematic drawing in a step subsequent to FIG. 7, but not limited thereto. As shown in FIG. 1, the manufacturing method of the semiconductor device 101 may include the following steps. The source/drain structure SD is formed on the III-V compound semiconductor layer 20. The source/drain structure SD includes a plurality of the metal silicide patterns 34 and the metal layer 62. The metal layer 62 is disposed on the metal silicide patterns 34, and a portion of the metal layer 62 is disposed between the metal silicide patterns 34 adjacent to each other.

Specifically, the manufacturing method of the semiconductor device in this embodiment may include but is not limited to the following steps. Firstly, as shown in FIG. 2, the buffer layer 12 and the III-V compound semiconductor layer 20 may be sequentially formed on the substrate 10, and the III-V compound semiconductor layer 20 may include the III-V compound semiconductor channel layer 22 and the III-V compound semiconductor cap layer 24 described above. Subsequently, as shown in FIG. 3, a part of the III-V compound semiconductor cap layer 24 is removed for forming a recess RC corresponding to the source/drain structure subsequently formed. In some embodiments, the recess RC may penetrate through the III-V compound semiconductor cap layer 24 for exposing a part of the III-V compound semiconductor channel layer 22, but not limited thereto. In some embodiments, two recesses RC may be formed for the two source/drain structures subsequently formed, and at least a portion of the III-V compound semiconductor cap layer 24 may be located between the two recesses RC in the second direction D2.

Subsequently, as shown in FIG. 3 and FIG. 4, a plurality of metal patterns 32 may be formed on the III-V compound semiconductor layer 20, and a silicon layer 40 may be formed covering the metal patterns 32 and the III-V compound semiconductor layer 20. In some embodiments, the metal patterns 32 may be formed on and contact the III-V compound semiconductor channel layer 22 exposed by the recess RC, but not limited thereto. In some embodiments, the metal patterns 32 may include titanium, aluminum, tantalum, molybdenum, or other suitable metallic materials. Subsequently, as shown in FIG. 4 and FIG. 5, an annealing process 91 is performed. At least a part of each of the metal patterns 32 and a part of the silicon layer 40 may be converted into the metal silicide pattern 34 by the annealing process 91, and the volume of each of the metal silicide patterns 34 may be slightly greater than the volume of each of the metal patterns 32, but not limited thereto. In some embodiments, the metal patterns 32 may be separated from one another, and the metal silicide patterns 34 formed of the metal patterns 32 may be separated from one another also, but not limited thereto. In some embodiments, the annealing process 91 may include a rapid thermal processing (RTP) or other suitable thermal treatments. In addition, the method of forming the metal silicide patterns 34 in the present invention is not limited to the steps described above, and the metal silicide patterns 34 may also be formed by other approaches according to some design considerations.

In some embodiments, the III-V compound semiconductor 20 may include nitrogen, the metal nitride layers 36 may be formed by the annealing process 91, and each of the metal nitride layers 36 may be located between one of the metal silicide patterns 34 and the III-V compound semiconductor layer 20. In some embodiments, the nitrogen in the III-V compound semiconductor layer 20 may move upwards to the metal patterns 32 by the annealing process 91 and may be combined with a portion of each of the metal patterns 32 (such as a lower portion of each of the metal patterns 32) for being converted into the metal nitride layer 36. Therefore, each of the metal nitride layer 36 may include nitride of a metallic element in the metal pattern 32 (such as titanium nitride, aluminum nitride, tantalum nitride, or molybdenum nitride, but not limited thereto), and each of the metal silicide patterns 34 may include a silicide of this metallic element (such as titanium silicide, aluminum silicide, tantalum silicide, or molybdenum silicide, but not limited thereto), but not limited thereto. In some embodiments, because the surface area of the metal patterns 32 contacted by the silicon layer 40 is larger than the surface area of the metal patterns 32 contacted by the II-V compound semiconductor layer 20 and/or the amount of the silicon moving into the metal patterns 32 is greater than that of the nitrogen moving into the metal patterns 32, the thickness of each of the metal silicide patterns 34 formed after the annealing process 91 may be greater than the thickness of each of the metal nitride layers 36 formed after the annealing process 91, but not limited thereto.

In some embodiments, the n-type semiconductor regions 52 and the n-type semiconductor regions 54 may be formed in the III-V compound semiconductor layer 20 by the annealing process 91, such as being formed in the III-V compound semiconductor channel layer 22. Each of the n-type semiconductor regions 52 may be disposed correspondingly to one of the metal silicide patterns 34 in the first direction D1, and the n-type semiconductor regions 54 may be disposed corresponding to the space between the metal silicide patterns in the first direction D1. In some embodiments, the nitrogen in the III-V compound semiconductor layer 20 may move upwards to the metal patterns 32 and/or the silicon layer 40 by the annealing process 91 for forming the metal nitride layers 36 and silicon nitride layers (such as a silicon nitride layer 42 and/or silicon nitride layers 44 shown in FIG. 5). Relatively, the n-type semiconductor region 52 and the n-type semiconductor region 54 may be regarded as the regions with relatively more nitrogen vacancies formed by losing nitrogen in the III-V compound semiconductor layer 20, and each of the n-type semiconductor regions 52 and each of the n-type semiconductor regions 54 may respectively include the n-type III-V compound semiconductor region induced by nitrogen vacancies accordingly. In some embodiments, each of the silicon nitride layers 44 may be located between the silicon layer 40 and the corresponding n-type semiconductor region 52, at least some of the silicon nitride layers 44 may be located between the metal nitride layers 36 adjacent to each other, and the silicon nitride layer 42 may be located between the silicon layer 40 and the III-V compound semiconductor cap layer 24.

In some embodiments, when the annealing process is performed with a metal layer (instead of the above-mentioned metal patterns 32 with space therebetween) globally formed on the portion of the III-V compound semiconductor layer 20 corresponding to the source/drain structure, excessive nitrogen vacancies may be generated in the III-V compound semiconductor layer 20 because larger amount of nitrogen may move upwards at an interface between the metal layer and the III-V compound semiconductor layer 20 and move into the metal layer. The lattice structure of the III-V compound semiconductor layer 20 may be damaged and related defects (such as voids formed in the lattice structure) may be generated because of the excessive nitrogen vacancies, and the semiconductor characteristics of the III-V compound semiconductor layer 20 may be influenced negatively. Therefore, the above-mentioned problems generated by the metal layer globally covering the portion of the III-V compound semiconductor layer 20 corresponding to the source/drain structure may be improved by performing the annealing process 91 with the metal patterns 32 and the silicon layer 40 covering the metal patterns 32, and the nitrogen of the III-V compound semiconductor layer 20 received by the metal patterns 32 may also be reduced by the metal silicide patterns 34 formed by the reaction between the silicon layer 40 and the metal patterns 32 for further avoiding forming excessive nitrogen vacancies in the III-V compound semiconductor layer 20.

In some embodiments, the capability of receiving and/or absorbing nitrogen in the metal pattern 32 may be different from that in the silicon layer 40, and the depth and/or the nitrogen vacancy density of the n-type semiconductor region 52 formed correspondingly may be different from that of the n-type semiconductor region 54 accordingly, but not limited thereto. Additionally, in some embodiments, the silicon nitride layers formed by the annealing process 91 (such as the silicon nitride layer 42 and/or the silicon nitride layers 44) may be used to absorb dangling bonds at the surface of the III-V compound semiconductor layer 20, and that will be beneficial to the electrical performance of the semiconductor device.

As shown in FIG. 5 and FIG. 6, after the annealing process 91, a removing process 92 may be performed for removing the silicon layer 40, the silicon nitride layer 42, and the silicon nitride layers 44. In some embodiments, the removing process 92 may include one or more etching processes with high etching selectivity for removing the silicon layer 40, the silicon nitride layer 42, and the silicon nitride layers 44 and reducing etching damage to other material layers (such as the metal silicide patterns 34, the metal nitride layers 36, and/or the III-V compound semiconductor layer 20). For example, the removing process 92 may include a wet etching step using hydrogen fluoride (HF), buffered oxide etchant (BOE), and/or other suitable etchants, but not limited thereto. Subsequently, as shown in FIG. 6 and FIG. 7, after removing the silicon layer 40, the silicon nitride layer 42, and the silicon nitride layers 44 by the removing process 92, the metal layer 62 may be formed for forming the source/drain structure SD including the metal layer 62, the metal silicide patterns 34, and the metal nitride layers 36. In other words, the silicon layer 40, the silicon nitride layer 42, and the silicon nitride layers 44 may be removed before the step of forming the metal layer 62.

As shown in FIG. 7 and FIG. 1, after the step of forming the source/drain structure SD, the protection layer 70 and the gate structure GS described above may be formed for forming the semiconductor device 101 shown in FIG. 1. By the manufacturing method described above, the n-type semiconductor regions 52 and the n-type semiconductor regions 54 may be formed in the III-V compound semiconductor layer 20 for reducing the contact resistance between the source/drain structure SD and the III-V compound semiconductor layer 20. In some embodiments, the contact resistance between the III-V compound semiconductor layer 20 and the metal silicide pattern 34 and/or the contact resistance between the III-V compound semiconductor layer 20 and the metal nitride layer 36 may be lower than the contact resistance between the III-V compound semiconductor layer 20 and the metal layer 62, and the contact resistance between the source/drain structure SD and the III-V compound semiconductor layer 20 may be further reduced by the metal silicide patterns 34 and/or the metal nitride layers 36 accordingly. Additionally, in the manufacturing method described above, the annealing process using the metal patterns and the silicon layer covering the metal patterns may be performed for forming the metal silicide patterns 34, the metal nitride layers 36, the n-type semiconductor regions 52, and the n-type semiconductor regions 54, and the forming condition of the n-type semiconductor regions 52 and the n-type semiconductor regions 54 may be controlled accordingly for avoiding generating excessive nitrogen vacancies in the III-V compound semiconductor layer 20 and the related negative effects. Therefore, the manufacturing method in this embodiment may be used to enhance the electrical performance of the semiconductor device 101 and improve the process stability.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 8:
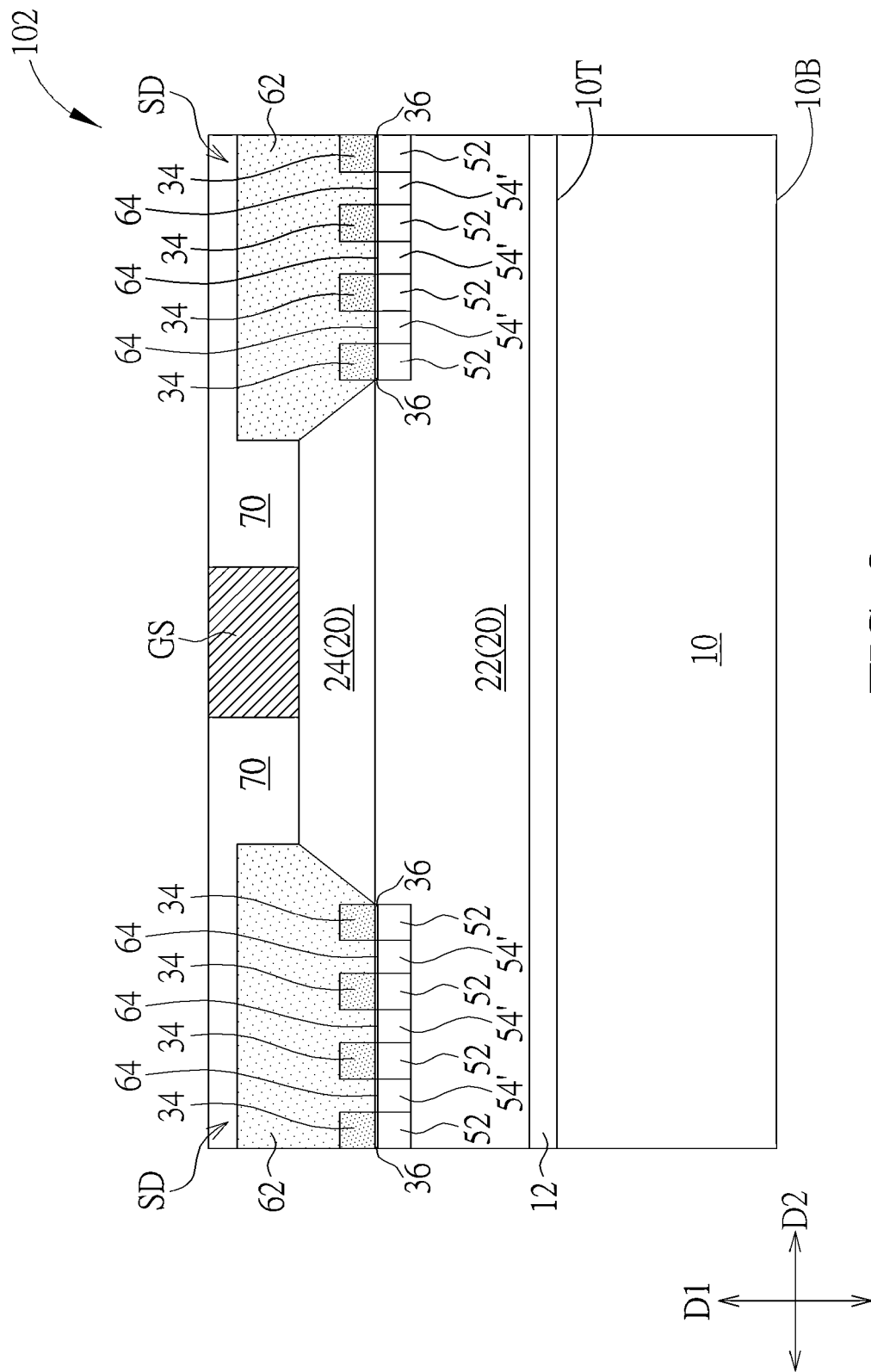
FIG. 8 is a schematic drawing illustrating a semiconductor device according to a second embodiment of the present invention.

Please refer to FIG. 8. FIG. 8 is a schematic drawing illustrating a semiconductor device 102 according to another embodiment of the present invention. As shown in FIG. 8, the semiconductor device 102 may include a plurality of n-type semiconductor regions 54' disposed in the III-V compound semiconductor layer 20, such as being disposed in the III-V compound semiconductor channel layer 22, but not limited thereto. The n-type semiconductor region 54' may include an n-type III-V compound semiconductor region induced by nitrogen vacancies or other suitable kinds of n-type III-V compound semiconductor regions. The n-type semiconductor regions 54' may be disposed corresponding to the metal layer 62 disposed between the metal silicide patterns 34 in the first direction D1, and at least some of the n-type semiconductor regions 54' may be located between the n-type semiconductor regions 52 adjacent to each other. In addition, the semiconductor device 102 may further include a plurality of metal nitride layers 64. Each of the metal nitride layers 64 may be disposed between the metal layer 62 and the corresponding n-type semiconductor region 54' in the first direction D1, and at least some of the metal nitride layers 64 may be disposed between the metal nitride layers 36 adjacent to each other. In some embodiments, each of the metal nitride layers 64 may include nitride of a metallic element in the metal layer 62, and the material composition of the metal nitride layer 64 may be different from the material composition of the metal nitride layer 36 when the metal layer 62 and the metal silicide pattern 34 respectively include different metallic elements.

Figure 9:
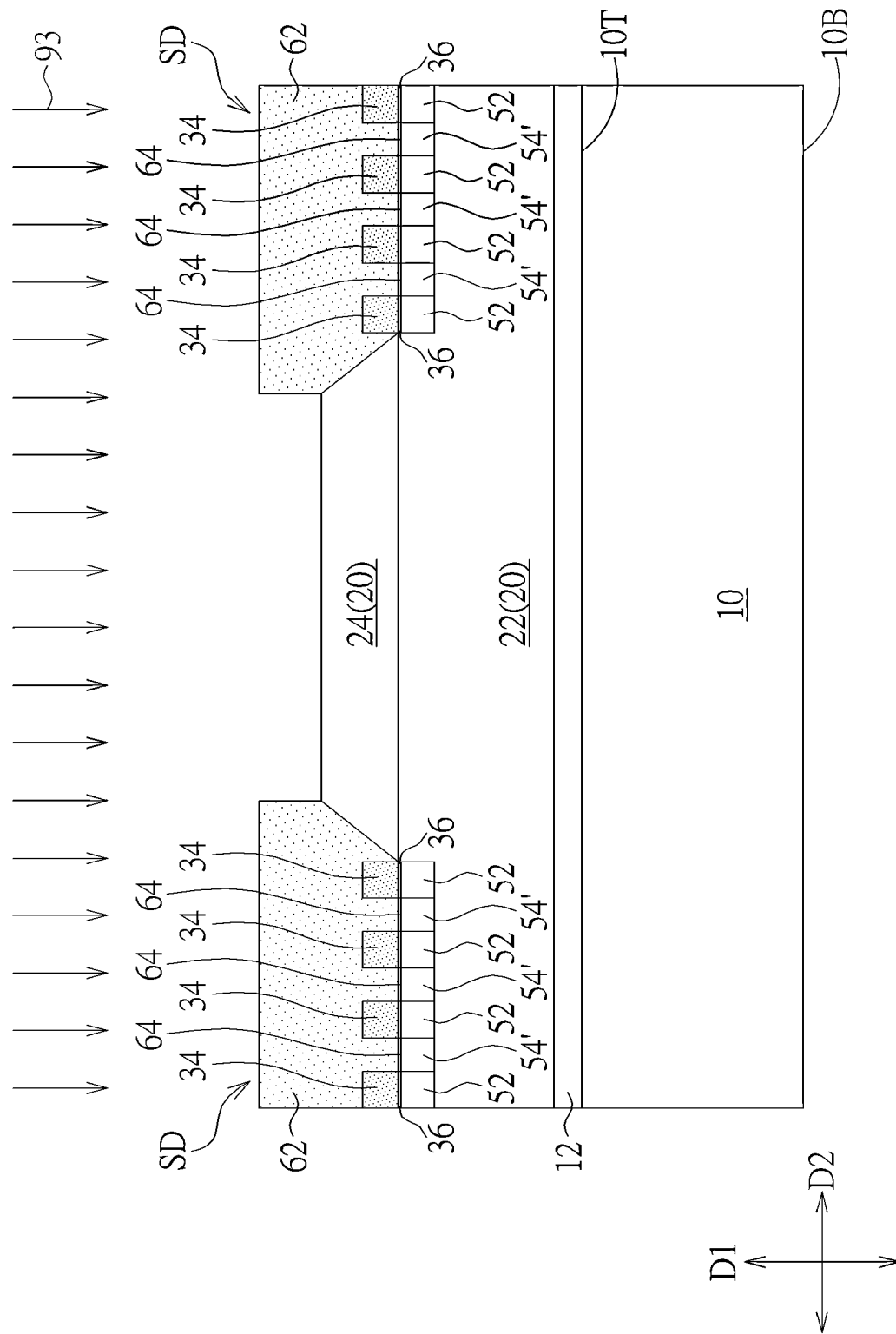
FIG. 9 is a schematic drawing illustrating a manufacturing method of the semiconductor device according to the second embodiment of the present invention.

Please refer to FIG. 9, FIG. 7, and FIG. 8. FIG. 9 is a schematic drawing illustrating a manufacturing method of the semiconductor device according to the second embodiment of the present invention. In some embodiments, FIG. 9 may be regarded as a schematic drawing in a step subsequent to FIG. 7, and FIG. 8 may be regarded as a schematic drawing in a step subsequent to FIG. 9, but not limited thereto. As shown in FIG. 7, FIG. 9, and FIG. 8, in some embodiments, after the step of forming the metal layer 62, another annealing process 93 may be performed. The metal nitride layers 64 may be formed by the annealing process 93, and the n-type semiconductor regions 54 may be converted into the n-type semiconductor regions 54' by the annealing process 93. In some embodiments, the annealing process 93 may include a rapid thermal processing or other suitable thermal treatments. It is worth noting that the annealing process 93 and the metal nitride layers 64 and/or the n-type semiconductor regions 54' formed correspondingly in this embodiment may also be applied in other embodiments of the present invention according to some design considerations.

Figure 10:
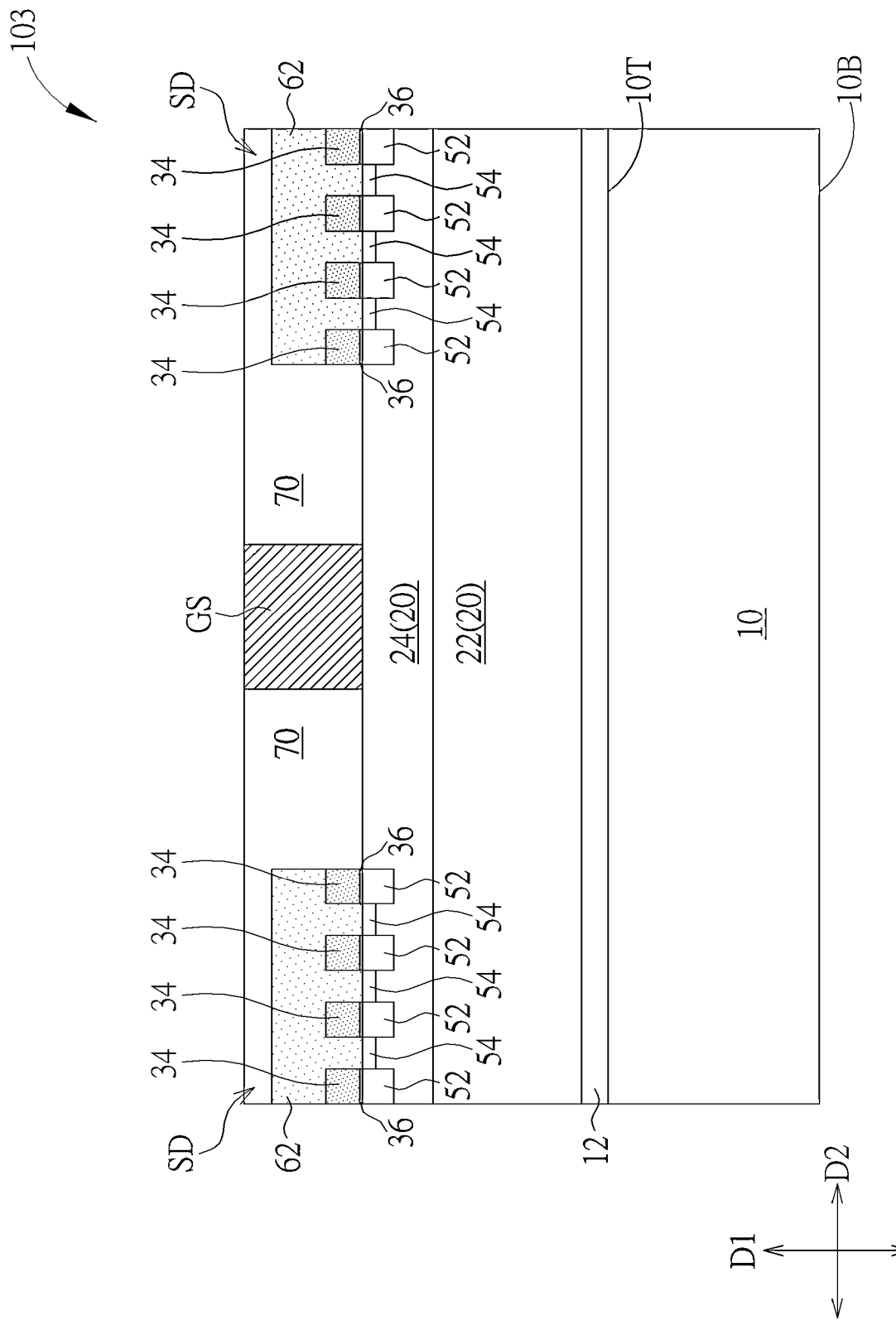
FIG. 10 is a schematic drawing illustrating a semiconductor device according to a third embodiment of the present invention.

Please refer to FIG. 10. FIG. 10 is a schematic drawing illustrating a semiconductor device 103 according to a third embodiment of the present invention. As shown in FIG. 10, in the semiconductor device 103, the source/drain structure SD may be disposed on the III-V compound semiconductor cap layer 24, and at least a part of the n-type semiconductor region 52 and at least a part of the n-type semiconductor region 54 may be disposed in the III-V compound semiconductor cap layer 24. In some embodiments, the metal layer 62, the metal silicide patterns 34, and the metal nitride layers 36 of the source/drain structure SD may be disposed on the III-V compound semiconductor cap layer 24 in the first direction D1, and the n-type semiconductor region 52 and the n-type semiconductor region 54 may be n-type III-V compound semiconductor regions induced by nitrogen vacancies in the III-V compound semiconductor cap layer 24. In addition, the manufacturing method of the semiconductor device 103 in this embodiment may be similar to the manufacturing method of the first embodiment described above except the step of forming the recess RC shown in FIG. 3.

Figure 11:
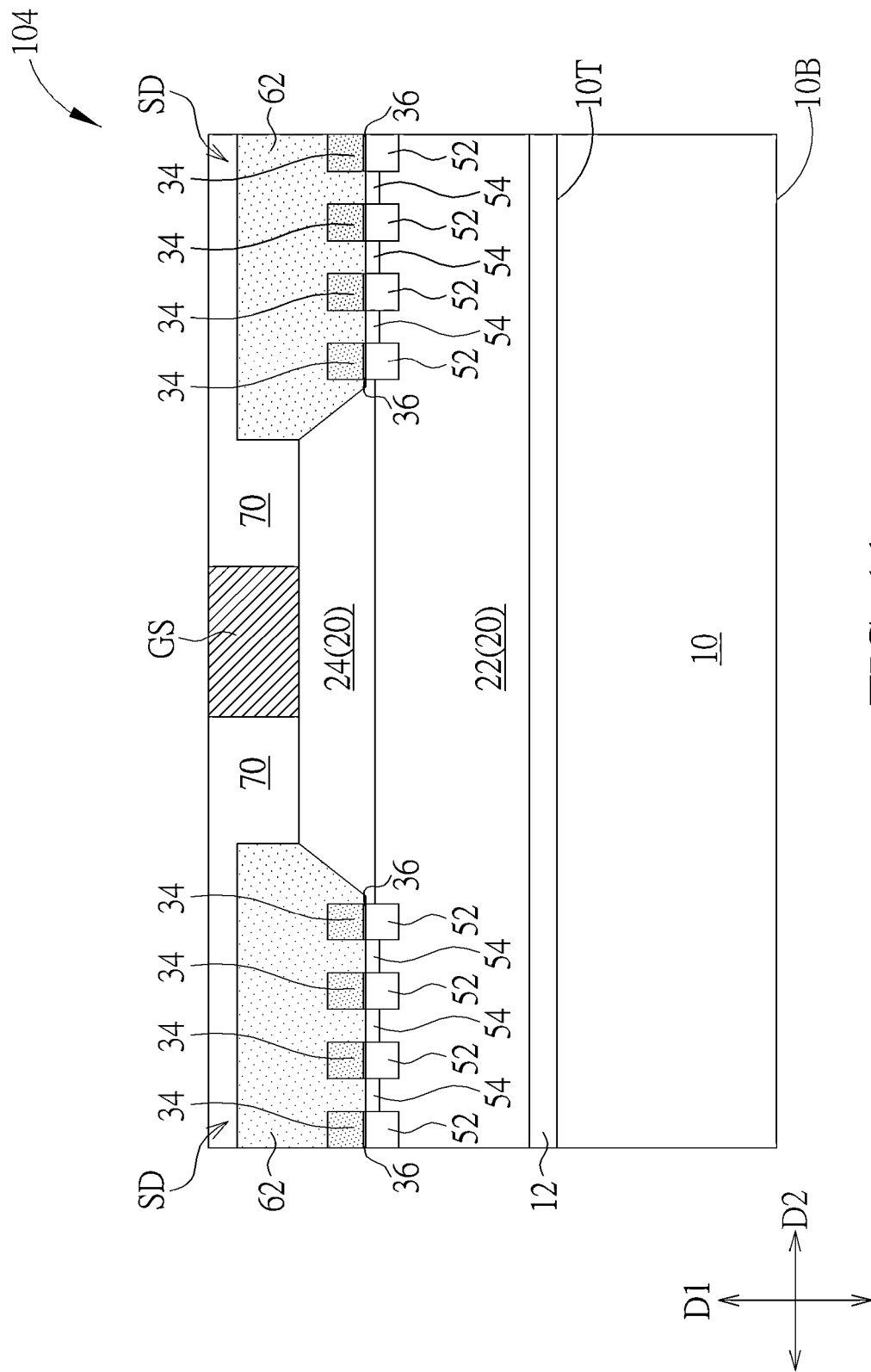
FIG. 11 is a schematic drawing illustrating a semiconductor device according to a fourth embodiment of the present invention.

Please refer to FIG. 11. FIG. 11 is a schematic drawing illustrating a semiconductor device 104 according to a fourth embodiment of the present invention. As shown in FIG. 11, in the semiconductor device 104, the source/drain structure SD may be disposed on the III-V compound semiconductor cap layer 24, and the n-type semiconductor region 52 may be partly formed in the III-V compound semiconductor cap layer 24 and partly formed in the III-V compound semiconductor channel layer 22. Additionally, the n-type semiconductor region 54 may also be partly formed in the III-V compound semiconductor cap layer 24 and partly formed in the III-V compound semiconductor channel layer 22, or the n-type semiconductor region 54 may be disposed in the III-V compound semiconductor cap layer 24 only. In addition, the interface between the source/drain structure SD and the III-V compound semiconductor cap layer 24 may be lower than the topmost surface of the III-V compound semiconductor cap layer 24 in the first direction D1. The manufacturing method of the semiconductor device 104 in this embodiment may be similar to the manufacturing method of the first embodiment described above, but the condition of the recess corresponding to the source/drain structure SD in this embodiment is different from that in the first embodiment.

Figure 12:
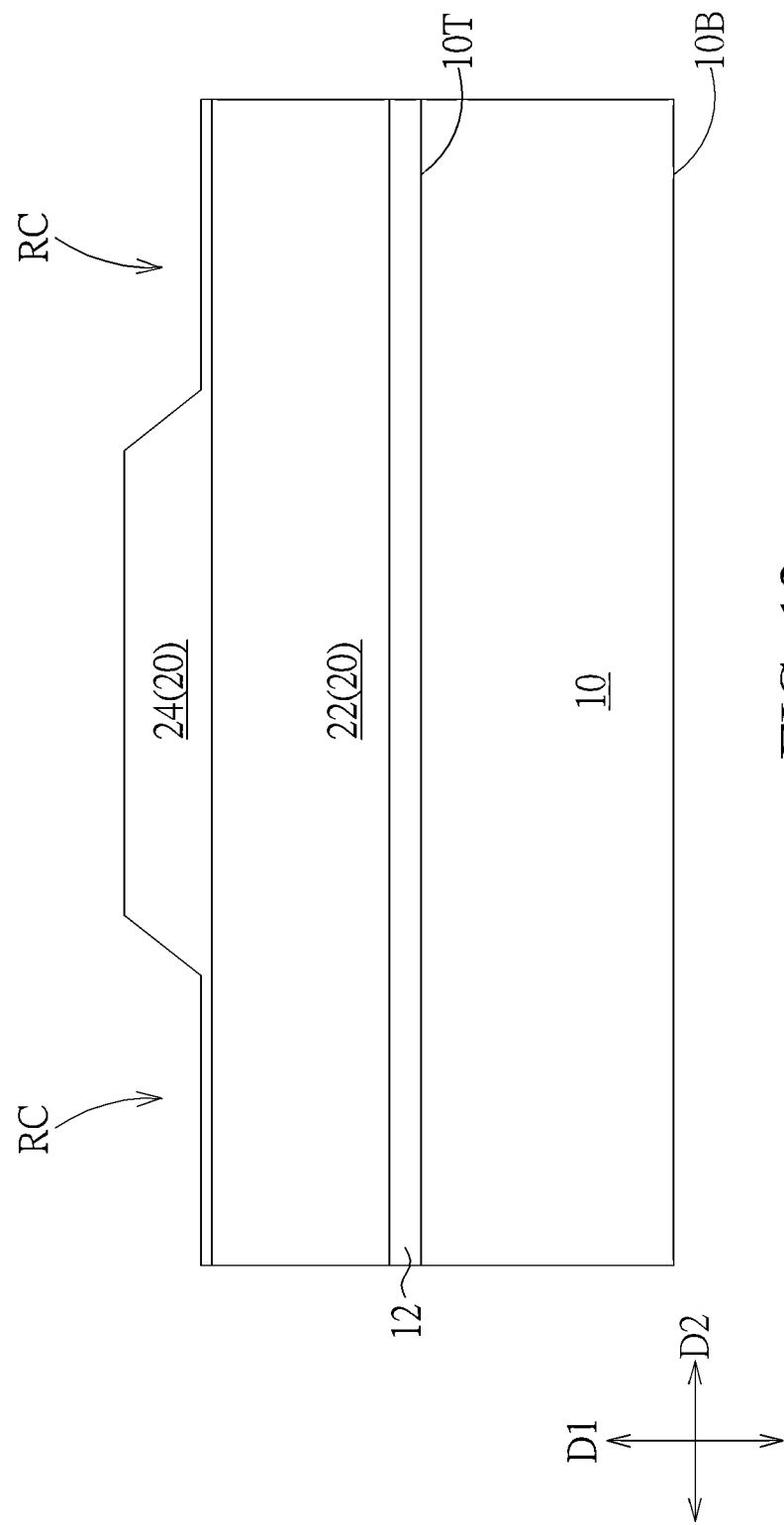
FIG. 12 is a schematic drawing illustrating a manufacturing method of the semiconductor device according to the fourth embodiment of the present invention.

Please refer to FIG. 11 and FIG. 12. FIG. 12 is a schematic drawing illustrating a manufacturing method of the semiconductor device according to the fourth embodiment of the present invention. In some embodiments, FIG. 11 may be regarded as a schematic drawing in a step subsequent to FIG. 12, but not limited thereto. As shown in FIG. 11 and FIG. 12, the recess RC corresponding to the source/drain structure SD may not penetrate through the III-V compound semiconductor cap layer 24 and the III-V compound semiconductor channel layer 22 is not exposed. Therefore, the metal patterns for forming the metal silicide patterns 34 may be formed on the III-V compound semiconductor cap layer 24 located corresponding to the recess RC, and the n-type semiconductor region 52 and/or the n-type semiconductor region 54 may be partly formed in the III-V compound semiconductor cap layer 24 and partly formed in the III-V compound semiconductor channel layer 22.

To summarize the above descriptions, in the semiconductor device and the manufacturing method thereof according to the present invention, the contact resistance between the source/drain structure and the III-V compound semiconductor layer may be reduced by the source/drain structure formed with the metal silicide patterns and the metal layer disposed on the metal silicide patterns and partly located between the metal silicide patterns adjacent to each other. In addition, the annealing process using the metal patterns and the silicon layer covering the metal patterns may be performed for forming the metal silicide patterns and the n-type semiconductor regions, and the forming condition of the n-type semiconductor regions may be controlled for avoiding generating excessive nitrogen vacancies in the III-V compound semiconductor layer and the related negative effects. Therefore, the manufacturing method in the present invention may be used to enhance the electrical performance of the semiconductor device and improve the process stability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:
    forming a source/drain structure on a III-V compound semiconductor layer, wherein the source/drain structure comprises:
        metal silicide patterns; and
        a metal layer disposed on the metal silicide patterns, wherein a portion of the metal layer is disposed between the metal silicide patterns adjacent to each other,
    wherein a method of forming the metal silicide patterns comprises:
        forming metal patterns on the III-V compound semiconductor layer;
        forming a silicon layer covering the metal patterns and the III-V compound semiconductor layer; and
        performing an annealing process, wherein at least a part of each of the metal patterns and a part of the silicon layer are converted into the metal silicide pattern by the annealing process,
    wherein first n-type semiconductor regions and second n-type semiconductor regions are formed in the III-V compound semiconductor layer by the annealing process, each of the first n-type semiconductor regions is located corresponding to one of the metal silicide patterns in a vertical direction, and the second n-type semiconductor regions are located corresponding to the portion of the metal layer disposed between the metal silicide patterns in the vertical direction.

2. The manufacturing method of the semiconductor device according to claim 1, wherein the metal patterns are separated from one another, and the metal silicide patterns are separated from one another.

3. The manufacturing method of the semiconductor device according to claim 1, wherein the III-V compound semiconductor layer comprises nitrogen, metal nitride layers are formed by the annealing process, and each of the metal nitride layers is located between one of the metal silicide patterns and the III-V compound semiconductor layer.

4. The manufacturing method of the semiconductor device according to claim 3, wherein each of the metal nitride layers comprises nitride of a metallic element in the metal patterns, and each of the metal silicide patterns comprises silicide of the metallic element.

5. The manufacturing method of the semiconductor device according to claim 1, wherein each of the first n-type semiconductor regions and each of the second n-type semiconductor regions respectively comprise an n-type III-V compound semiconductor region induced by nitrogen vacancies.

6. The manufacturing method of the semiconductor device according to claim 1, wherein the III-V compound semiconductor layer comprises:
    a III-V compound semiconductor channel layer; and
    a III-V compound semiconductor cap layer disposed on the III-V compound semiconductor channel layer, wherein at least a part of each of the first n-type semiconductor regions and at least a part of each of the second n-type semiconductor regions are formed in the III-V compound semiconductor channel layer.

7. The manufacturing method of the semiconductor device according to claim 1, further comprising:
    removing the silicon layer before the metal layer is formed.

* * * * *